(12) United States Patent
Kurokawa et al.

(10) Patent No.: US 6,646,918 B2
(45) Date of Patent: Nov. 11, 2003

(54) SEMICONDUCTOR LEVEL SHIFTER CIRCUIT

(75) Inventors: Takayuki Kurokawa, Tokyo (JP); Hiroshi Sugawara, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/054,085

(22) Filed: Jan. 22, 2002

(65) Prior Publication Data

US 2002/0097606 A1 Jul. 25, 2002

(30) Foreign Application Priority Data

Jan. 24, 2001 (JP) ........................................ 2001-015900

(51) Int. Cl.$^7$ .............................................. G11C 11/34
(52) U.S. Cl. .............................. 365/185.18; 365/189.11
(58) Field of Search ......................... 365/185.18, 189.11

(56) References Cited

U.S. PATENT DOCUMENTS 5,781,026 A  * 7/1998 Chow ........................... 326/26

OTHER PUBLICATIONS

Betty Prince, "Semiconductor Memories", 1983, Wiley, 2$^{nd}$ edition, pp. 196–198.*

* cited by examiner

*Primary Examiner*—Michael Thanh Tran
(74) *Attorney, Agent, or Firm*—Darryl G. Walker; Bradley T. Sako

(57) ABSTRACT

A level shifter (1) that may provide a relatively high-speed operation in a level shifting mode and a non-level shifting mode has been disclosed. Level shifter (1) may include a transistor (P101) providing a controllable current path between a voltage terminal (3) and an output signal (TOUT) based on the logic level of an input signal (IN). Series connected transistors (P104 and P105) may provide a controllable current path between voltage terminal (3) and output signal (TOUT) based on the logic level of an input signal (IN). Transistor (P105) may be enabled in a Vcc mode and may be disabled in a Vpp mode. In this way, an equivalent transistor width (WT) may be adjusted in accordance with a mode of operation and a transition time of output signal (TOUT) may be improved.

20 Claims, 6 Drawing Sheets

SEMICONDUCTOR LEVEL SHIFTER CIRCUIT

TECHNICAL FIELD

The present invention relates generally to a semiconductor circuit and more particularly to a semiconductor circuit that can be used as a level shifter in a semiconductor device such as a non-volatile memory.

BACKGROUND OF THE INVENTION

Level shifters or level translators are used to receive logic signals at one voltage range and produce logic signals having a higher voltage range.

Referring now to FIG. 7, a conventional level shifter is set forth in a circuit schematic diagram and given the general reference character 700.

Conventional level shifter 700 receives an input signal IN having a high logic level provided by a Vcc power supply and provides an output signals (BOUT and TOUT) that has a high logic level provided by a Vpp power supply. Both the input signal IN and output signals (BOUT and TOUT) have a low logic level at the ground potential. The Vpp power supply is provided by boosting the Vcc voltage using a booster circuit. In this way, conventional level shifter 700 receives an input signal having a voltage range between ground and Vcc and provides an output signal having a voltage range between ground and Vpp.

Conventional level shifter 700 includes p-channel MOS (metal-oxide-semiconductor) transistors (P101 and P102), n-channel MOS transistors (N101 and N102), and in inverter V101.

Transistor P101 has a source and a body (substrate or well) connected to the power supply terminal, a drain connected to output signal BOUT, and a gate connected to output signal TOUT. Output signal TOUT is a true output signal and output signal BOUT is a complementary output signal. Transistor P102 has a source and a body (substrate or well) connected to the power supply terminal, a drain connected to output signal TOUT, and a gate connected to output signal BOUT.

Transistor N101 has a source and a body (substrate or well) connected to ground, a drain connected to output signal BOUT, and a gate connected to receive input signal IN. Transistor N102 has a source and a body (substrate or well) connected to ground, a drain connected to output signal TOUT, and a gate connected to receive signal INB. Inverter V101 received input signal IN at an input and provides signal INB as an output.

Output signal TOUT is of the same logic level as input signal IN. Output signal BOUT has a logic level that is inverted with respect to input signal IN.

The operation of conventional level shifter 700 will now be described.

When input signal IN is low, transistor N101 is turned off and inverter V101 applies a high to the gate of transistor N102. Thus, transistor N102 is turned on and pulls output signal TOUT to ground. With output signal TOUT low, transistor P101 is turned on and pulls output signal BOUT to the power supply potential. With output signal POUT being at the power supply potential transistor P102 is turned off. Thus, when inputs signal IN is low, output signal BOUT is at the power supply potential (VPP) or high and output signal TOUT is at ground or low.

When input signal IN is changed from low to high, transistor N101 is turned on and inverter V101 applies a low to the gate of transistor N102. Thus, transistor N102 is turned off. With transistor N101 turned on, output signal BOUT is pulled low. As output signal BOUT is pulled low, transistor P102 is turned on and pulls output signal TOUT toward the power supply potential or high. With output signal TOUT being at the power supply potential transistor P101 is turned off. Thus, when inputs signal IN is high, output signal TOUT is at the power supply potential (VPP) or high and output signal BOUT is at ground or low.

If a level shifter is only to provide level shifting from the Vcc voltage to the Vpp voltage, then conventional level shifter 700 may be sufficient.

However, in some applications, a level shifter needs to provide level shifting from the Vcc voltage to the Vpp voltage during certain operations and not provide level shifting (keep the output signals supplied by the Vcc voltage) at all in other operations. One such application is in a flash memory where a Vpp voltage level may be applied to a memory cell in a write, but data may be read at the Vcc voltage level. It can be difficult to design a level shifter that can operate at the same switching speed for both voltage output levels (Vpp and Vcc). Problems for this case will now be discussed.

The conventional example provides a pull down with n-channel MOS transistors and a pull up with p-channel MOS transistors. When the p-channel MOS transistor is beginning to pull up an output signal, Vds>Vgs−Vtp in the p-channel MOS transistor, where Vds is the drain-source voltage, Vgs is the gate-source voltage and Vtp is the threshold voltage of the p-channel MOS transistor. With Vds>Vgs−Vtp, the p-channel MOS transistor operates in the saturation region.

Also, when the n-channel MOS transistor is beginning to pull down an output signal, Vds>Vgs−Vtn in the n-channel MOS transistor, where Vds is the drain-source voltage, Vgs is the gate-source voltage and Vtn is the threshold voltage of the n-channel MOS transistor. With Vds>Vgs−Vtn, the n-channel MOS transistor operates in the saturation region.

When in the saturation region the drain current Id of a MOS transistor is obtained by the equation:

$Id=K(V-Vt)^2 \times W/L$, where K is a constant obtained by the channel mobility and the dielectric constant of the oxide film, W is the channel width of the MOS transistor, and L is the channel length of the MOS transistor. V represents the value of the voltage applied between the gate and the source of the MOS transistor and Vt is the threshold voltage of the MOS transistor.

When conventional level shifter 700 has the Vcc supply applied to the power supply terminal, the voltage applied between the gate and the source of the p-channel MOS transistors (P101 or P102) is much lower than when conventional level shifter 700 has the Vpp supply applied to the power supply terminal. Thus, the drain current of the p-channel MOS transistors (P101 or P102 will be much lower when conventional level shifter 700 has the Vcc supply applied to the power supply terminal than when Vpp is supplied to the power supply terminal. If the transistor size (channel width Wp and Wn) of the respective transistors (N101, N102, P101, and P102) in conventional level shifter 700 are designed in accordance with the operation at the Vpp voltage, operating characteristics at the Vcc voltage may suffer.

In the n-channel MOS transistors (N101 and N102), the gate-source voltage (Vgs) does not change in accordance with which power supply (Vdd or Vpp) is connected to the power supply terminal and the drain current Id is the same for both cases. Therefore, the drain current of the p-channel MOS transistors is reduced when Vcc is supplied to the power supply terminal which makes the output signals (BOUT and TOUT) rise slower than when Vpp is supplied to the power supply terminal.

On the other hand, if the respective transistors in conventional level shifter 700 are optimally designed in accordance with Vcc being supplied to the power supply terminal, the n-channel MOS transistors may not be able to supply sufficient current to overcome the p-channel MOS transistors when Vpp is supplied to the power supply terminal. Therefore, when the output signal is changed from high to low, the p-channel MOS transistor, which is turned on, may not be quickly overpowered by the n-channel MOS transistor which can increase the high to low switching time of the output signal. With an increased high to low switching time, the p-channel MOS transistor stays turned on longer and current can flow through from the power supply terminal to ground which increases current consumption.

Also, conventional level shifter 700 may not be able to lower the level of an output signal to ground unless the channel width (Wn) of the n-channel MOS transistors have a large enough value to provide sufficient driving capabilities. As a result, voltage levels of the output signals (TOUT and BOUT) may not be at sufficient logic levels (power supply or ground).

Referring now to FIG. 10, a circuit schematic diagram of a conventional level shifter is set forth and given the general reference character 1000. Conventional level shifter 1000 is obtained by adding transistors (P111 and P112 and N111 to N116) to conventional level shifter 700. Transistors (P111 and P112) are p-channel MOS transistors and transistors (N111 to N116) are n-channel MOS transistors. Transistors (P111 and P112 and N111 to N116) have been added for the purpose of snap-back prevention and improvement in hot electron resistance.

The operation of conventional level shifter 1000 of FIG. 10 is substantially the same as the operation of conventional level shifter 700 of FIG. 7.

Transistors (P101 and P102) have a channel width Wp of 5.0 $\mu$m and a channel length L of 1.2 $\mu$m. Transistors (N101 and N102) have a channel width Wn of 240.0 $\mu$m and a channel length of 1.2 $\mu$m.

FIGS. 8 and 9 are waveform diagrams illustrating the relationship between the voltage level change of the inputs signal IN and the voltage level of the output signals (BOUT and TOUT) in the operation of conventional level shifter 1000. FIG. 8 illustrates the case where Vcc is applied to the power supply terminal. FIG. 9 illustrates the case where Vpp is applied to the power supply terminal. FIGS. 8 and 9 illustrate SPICE simulation results. In FIGS. 8 and 9, the axis of abscissa indicates time and the axis of ordinate indicates voltage levels of input and output signals. In FIGS. 8 and 9, Vcc=1.5 V and Vpp=10.0 V. FIGS. 8 and 9, illustrate results from three cases, a low Vt, a typical Vt, and a high Vt of transistors.

As illustrated in FIG. 9 (Vpp connected to power supply terminal), when the input signal IN transitions from low to high, the time difference between output signal BOUT going low and output signal TOUT going high is not great.

However, as illustrated in FIG. 8 (Vcc connected to power supply terminal), when the input signal IN transitions from low to high, the time difference between output signal BOUT going low and output signal TOUT going high is large.

This indicates that the driving ability of p-channel MOS transistors (P101 and P102) is insufficient when Vcc is applied to the power supply terminal. This is because the n-channel MOS transistors (N101 and N102) have been sized (Wn/L) in accordance with the case where Vpp is applied to the power supply terminal and the large Wn can make the drain capacitance large.

In view of the above discussion, it would be desirable to provide a semiconductor circuit such as a level shifter that may be capable of quickly providing level shifted output signals in response to an input signal when a power supply of Vpp is applied to a power supply terminal. It would also be desirable to provide a level shifter capable of quickly providing non-level shifted outputs in response to an input signal when a power supply of Vcc is applied to a power supply terminal. It would also be desirable to provide a level shifter having desired operations without increasing the channel width of a n-channel MOS transistor.

SUMMARY OF THE INVENTION

According to the present embodiments, a level shifter that may provide a relatively high-speed operation in a level shifting mode and a non-level shifting mode has been disclosed. A level shifter may include a transistor providing a controllable current path between a voltage terminal and an output signal based on a logic level of an input signal. Series connected transistors may provide a controllable current path between a voltage terminal and an output signal based on the logic level of an input signal. One of series connected transistors may be enabled in a Vcc mode and may be disabled in a Vpp mode. In this way, an equivalent transistor width may be adjusted in accordance with a mode of operation and a transition time of an output signal may be improved.

According to one aspect of the embodiments, a level shifter may include a first drive circuit coupled between a first power supply terminal and a first output node. A second drive circuit may be coupled between the first power supply terminal and a second output node. A third drive circuit may be coupled between a reference potential and the first output node. A fourth drive circuit may be coupled between the reference potential and the second output node. The first drive circuit may have a first effective drive circuit width and the second drive circuit may have a second drive circuit width. The first and second drive circuit widths may be adjusted in accordance with a voltage level of the first power supply terminal.

According to another aspect of the embodiments, the first drive circuit may include a first insulated gate field effect transistor (IGFET) having a first type conductivity and a second IGFET having the first type conductivity providing parallel current paths between the first power supply potential and the first output node. The first IGFET may have a control gate coupled to the second output node and the second IGFET may have a control gate coupled to the second output node. The second drive circuit may include a third IGFET having the first type conductivity and a fourth IGFET having the first type conductivity providing parallel current paths between the first power supply potential and the second output node. The third IGFET may have a control gate coupled to the first output node and the fourth IGFET may have a control gate coupled to the first output node.

According to another aspect of the embodiments, the third drive circuit may include a fifth IGFET having a second type conductivity. The fifth IGFET may have a current path coupled between the first output node and the reference potential and a control gate coupled to receive a first input signal. The fourth drive circuit may include a sixth IGFET.

The sixth IGFET may have a current path coupled between the second output node and the reference potential and a control gate coupled to receive a second input signal.

According to another aspect of the embodiments, the first drive circuit may include a seventh IGFET having the first type conductivity. The seventh IGFET may provide a current path between the second IGFET and the first output node. The second drive circuit may include an eighth IGFET having the first type conductivity. The eighth IGFET may provide a current path between the fourth IGFET and the second output node. The current paths of the seventh IGFET and eighth IGFET may be enabled and disabled in accordance with the voltage level of the first power supply terminal.

According to another aspect of the embodiments, a control circuit may be coupled to receive the voltage level of the first power supply terminal and may provide a control signal to a control gate of the seventh IGFET and a control gate of the eighth IGFET.

According to another aspect of the embodiments, the control signal may enable the current paths of the seventh and eighth IGFETs when the voltage level of the first power supply terminal does not exceed essentially a predetermined potential and may disable the current paths of the seventh and eighth IGFETs when the voltage level of the first power supply terminal does not exceed the predetermined potential.

According to another aspect of the embodiments, the level shifter may be provided in a column decoder. The column decoder may select at least one column of memory cells arranged in a matrix of rows and columns of memory cells in response to an address value. The level shifter may operate at different voltage levels based on a data read operation or a data write operation.

According to another aspect of the embodiments, a level shifter may include a first drive current path coupled between a power supply node and an output node. A second drive current path may be coupled between the power supply node and the output node. The second drive current path may be enabled when the power supply node is at a first potential and disabled when the power supply node is at a second potential.

According to another aspect of the embodiments, the first potential may be lower than the second potential.

According to another aspect of the embodiments, the level shifter may be coupled to receive an input signal having a first logic level at essentially the first potential.

According to another aspect of the embodiments, an input signal may have a second logic level at essentially a ground potential.

According to another aspect of the embodiments, the level shifter may be included in a decoder circuit in a semiconductor memory device.

According to another aspect of the embodiments, the semiconductor memory device may be an electrically programmable non-volatile memory and the power supply node may be at the first potential during a read operation and at the second potential during a write operation.

According to another aspect of the embodiments, a semiconductor device may include a first mode of operation where a first power supply potential may be supplied to a power supply terminal and a second mode of operation where a second power supply potential may be supplied to the power supply terminal. A level shifter may provide a shift between the first power supply potential and the second power supply potential in the first mode of operation. The level shifter may include a first drive circuit coupled to provide a first current path between the power supply terminal and a first output node in response to a first logic level of an input signal. A second drive circuit may be coupled to provide a second current path between the power supply terminal and the first output node in response to the first logic level of the input signal when in the second mode of operation and may provide a high impedance path between the power supply terminal and the first output node in the first mode of operation.

According to another aspect of the embodiments, the first drive circuit may include a first IGFET coupled to provide a low impedance path between the power supply terminal and the first output node in response to the first logic level of the input signal and a high impedance path between the power supply terminal and the first output node in response to a second logic level of the input signal. The second drive circuit may include a second IGFET coupled to provide a low impedance path between the power supply terminal and the first output node in response to the first logic level of the input signal and a high impedance path between the power supply terminal and the first output node in response to the second logic level of the input signal.

According to another aspect of the embodiments, the second drive circuit may include a third IGFET coupled between the power supply terminal and the first output node in series with the second IGFET. The third IGFET may be coupled to provide a low impedance path between the power supply terminal and the first output node in the second mode of operation and a high impedance path between the power supply terminal and the first output node in the first mode of operation.

According to another aspect of the embodiments, the level shifter may include a third drive circuit coupled to provide a third current path between a reference potential and the first output node in response to the second logic level of the input signal.

According to another aspect of the embodiments, the level shifter may include a fourth drive circuit coupled to provide a fourth current path between the power supply terminal and a second output node in response to the second logic level of the input signal. A fifth drive circuit may be coupled to provide a fifth current path between the power supply terminal and the second output node in response to the second logic level of the input signal when in the second mode of operation and provide a high impedance path between the power supply terminal and the second output node in the first mode of operation.

According to another aspect of the embodiments, the first drive circuit may include a first IGFET coupled to provide a low impedance path between the power supply terminal and the first output node in response to the first logic level of the input signal and a high impedance path between the power supply terminal and the first output node in response to a second logic level of the input signal. The second drive circuit may include a second IGFET coupled to provide a low impedance path between the power supply terminal and the first output node in response to the first logic level of the input signal and a high impedance path between the power supply terminal and the first output node in response to the second logic level of the input signal. The fourth drive circuit may include a third IGFET coupled to provide a low impedance path between the power supply terminal and the second output node in response to the second logic level of the input signal and a high impedance path between the power supply terminal and the second output node in response to a first logic level of the input signal. The fifth drive circuit may include a fourth IGFET coupled to provide a low impedance path between the power supply terminal and the second output node in response to the second logic level of the input signal and a high impedance path between the power supply terminal and the second output node in response to the first logic level of the input signal.

According to another aspect of the embodiments, the second power supply potential may be generated by boosting the first power supply potential.

DETAILED DESCRIPTION OF THE EMBODIMENTS

Various embodiments of the present invention will now be described in detail with reference to a number of drawings.

Figure 1:
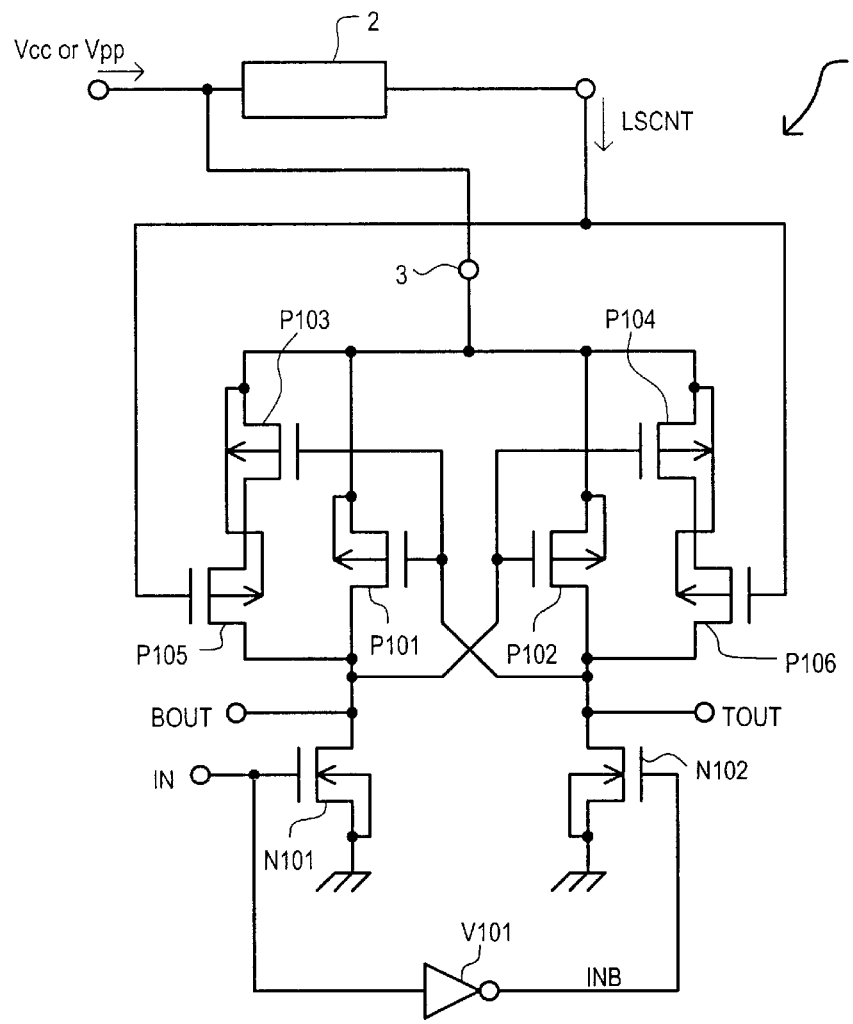
FIG. 1 is a circuit schematic diagram of a level shifter according to one embodiment.

Referring now to FIG. 1, a circuit schematic diagram of a level shifter according to one embodiment is set forth and given the general reference character 1.

Level shifter 1 may include similar constituents as conventional level shifter 700. Such constituents may be referred to by the same reference character.

Level shifter 1 may include a gate control circuit 2, transistors (P101 to P106), transistors (N101 and N102), and an inverter V101. Transistors (P101 to P106) may be p-type insulated gate field effect transistors (IGFETs), such as p-channel MOS transistors, as just one example. Transistors (N101 and N102) may be n-type IGFETs, such as n-channel MOS transistors, as just one example.

Level shifter 1 may receive a voltage potential (VCC or VPP) and an input signal IN and may provide output signals (TOUT and BOUT) at output terminals. Output signals (TOUT and BOUT) may essentially have a logic high value at voltage potential (VCC or VPP) and a logic low essentially at the ground potential. In this way, level shifter 1 may provide output signals (TOUT and BOUT) having a level shifted from voltage potential VCC to voltage potential VPP when voltage potential VPP is applied or output signals (TOUT and BOUT) having an essentially unshifted level when voltage potential VCC is applied.

Transistor P101 may have a source and a body (well or substrate) connected to a voltage terminal 3, a drain connected to output signal BOUT, and a gate connected to receive output signal TOUT. Transistor P102 may have a source and a body (well or substrate) connected to a voltage terminal 3, a drain connected to output signal TOUT, and a gate connected to receive output signal BOUT. Transistor N101 may have a source and a body (well or substrate) connected to a ground potential, a drain connected to output signal BOUT, and a gate connected to receive input signal IN. Transistor N102 may have a source and a body (well or substrate) connected to a ground potential, a drain connected to output signal TOUT, and a gate connected to receive an output INB of inverter V101. Inverter V101 may receive input signal IN as an input.

Transistor P103 may have a source and a body (well or substrate) connected to a voltage terminal 3, a drain connected to a source of transistor P105, and a gate connected to receive output signal TOUT. Transistor P105 may have a body (well or substrate) connected to a voltage terminal 3, a drain connected to output signal BOUT, and a gate connected to receive control signal LSCNT. Transistor P104 may have a source and a body (well or substrate) connected to a voltage terminal 3, a drain connected to a source of transistor P106, and a gate connected to receive output signal BOUT. Transistor P106 may have a body (well or substrate) connected to a voltage terminal 3, a drain connected to output signal TOUT, and a gate connected to receive control signal LSCNT.

Gate control circuit 2 may receive a power supply potential (VPP or VCC) and may provide control signal LSCNT.

Transistors (P103 and P105) may be connected in series to form a controllable impedance path connected in parallel to transistor P101. Transistors (P104 and P106) may be connected in series to form a controllable impedance path connected in parallel to transistor P102.

Transistor P105 may be turned on to allow transistor P103 to provide a current path in parallel to the current path provided by transistor P101. Transistor P106 may be turned on to allow transistor P104 to provide a current path in parallel to the current path provided by transistor P102.

Control signal LSCNT may be provided from gate control circuit 2. Control signal LSCNT may control the turning on and turning off of transistors (P105 and P106).

Transistors (P101 to P106, N101, and N102) may have a gate length L that may be the same as in the conventional level shifter 700.

Transistors (P101 and P102) may each have channel widths of "Wp1". Transistors (P103 and P104) may each have channel widths of "Wp2". Transistors (P105 and P106) may each have channel widths of "Wp3". Transistors (N101 and N102) may each have channel widths of "Wn1".

A voltage switching circuit (not shown) may switch a power supply provided to control circuit 2 and voltage terminal 3 between a Vcc power supply and a Vpp power supply. A Vcc power supply may be an external power supply and a Vpp power supply may be an internally generated power supply, as just two examples. A Vpp power supply may be generated from a Vcc power supply by a booster circuit (not shown). A voltage switching circuit may input a power supply (Vcc or Vpp) to gate control circuit 2 based on an operation mode. In a Vcc mode, level shifter 1 may be driven by a Vcc power supply and in a Vpp mode, level shifter 1 may be driven by a Vpp power supply.

Gate control circuit 2 may provide a control signal LSCNT having a logic level corresponding as to whether a Vcc power supply potential or a Vpp power supply potential is received. When a Vcc power supply potential is received, control signal LSCNT may have a low logic level. When a Vpp power supply potential is received, control signal LSCNT may have a high logic level.

An example of the operation of level shifter 1 will now be described.

When a Vpp mode is active, a Vpp power supply potential may be input as a drive voltage to level shifter 1 from a voltage switching circuit.

Gate control circuit 2 may receive a Vpp power supply potential and may provide a control signal LSCNT having a high level when it has been determined that the received potential is greater than a predetermined value.

Control signal LSCNT having a high level may be applied to gates of transistors (P105 and P106). In this way, transistors (P105 and P106) may be turned off.

When transistors (P105 and P106) are turned off, level shifter 1 may essentially operate in the same manner as conventional level shifter 700.

When an input signal IN having a high level (essentially a Vcc potential) is applied to a gate of transistor N101, transistor N101 may be turned on. At essentially the same time, inverter V101 may provide a low level (essentially a ground potential) to a gate of transistor N102 and transistor N102 may be turned off.

With transistor N101 turned on, output signal BOUT may be pulled low to essentially ground. With output signal BOUT low, transistor P102 may be turned on and output signal TOUT may be pulled high to essentially a Vpp potential. With output signal TOUT at essentially a Vpp potential, transistor P101 may be turned off. As a results, level shifter 1 may provide an output signal BOUT having a low level (essentially ground) and an output signal TOUT having a high level (essentially a Vpp potential) in response to an input signal IN having a high level (essentially a Vcc potential).

A channel width Wn1 of transistors (N101 and N102) may be set such that a ratio of a current capacity between transistor N101 and transistor P101 and between transistor N102 and transistor P102 may be sufficient to provide a desired high to low switching times at output signal (BOUT and TOUT) in accordance with design targets for a Vcc potential and Vpp potential when input signal IN makes a logic transition.

A channel width Wp1 of transistors (P101 and P102) may be set to provide a desired low to high switching time at output signals (BOUT and TOUT) in accordance with design targets of a Vpp potential when level shifter 1 operates in the Vpp mode and input signal IN makes a logic transition. Because it may not be necessary to set a channel width Wp1 of transistors (P101 and P102) in accordance with a Vcc mode, a channel width Wp1 may be smaller in level shifter 1 than in a conventional level shifter.

As a channel width Wp1 of transistors (P101 and P102) are reduced, a channel width Wn1 of transistors (N101 and N102) may be set to be smaller.

Figure 10:
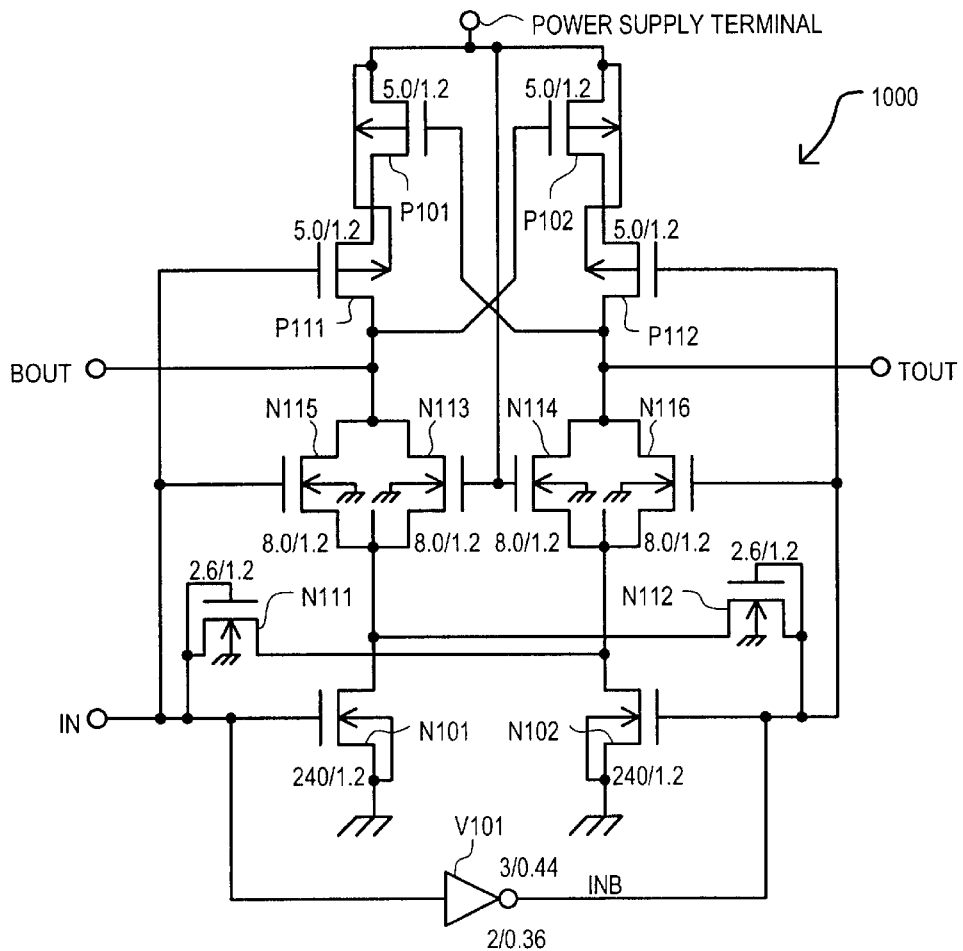
FIG. 10 is a circuit schematic diagram of a conventional level shifter.

In conventional level shifter 1000 as illustrated in FIG. 10, transistors (P101 and P102) have a channel width Wp of 5.0 μm and a channel length L of 1.2 μm and transistors (N101 and N102) may have a channel width Wn of 240 μm and a channel length L of 1.2 μm.

If a transistor size of transistors (P101 and P102) in level shifter 1 of FIG. 1 is set to have a channel width Wp of approximately 2.5 μm (approximately one-half the size as compared to the conventional level shifter) and a channel length L of approximately 1.2 μm, the current capacity of transistors (P101 and P102) may be essentially halved.

Accordingly, a current capacity of transistors (N101 and N102) may be essentially halved. Thus, transistors (N101 and N102) in level shifter 1 may have a channel width that can be essentially one-half of the channel width of transistors (N101 and N102) in the conventional level shifter 1000 of FIG. 10. In this way, transistors (N101 and N102) in level shifter 1 may have a channel width Wn of essentially 120 μm and a channel length L of essentially 1.2 μm.

In this way, sizes of transistors (N101, N102, P101 and P102) may be designed disregarding the Vcc mode operation. Therefore, transistors (N101, N102, P101 and P102) may be designed to have the above-mentioned sizes and may provide current driving capabilities actually required to provide output signals (TOUT and BOUT) as may be desired.

As a result, the response speed of output signal (BOUT and TOUT) in level shifter 1 may be similar to the response speeds in a conventional level shifter. This may be particularly true for the response speed of output signal (BOUT and TOUT) when changing from a high to a low level.

When a Vcc mode is active, a Vcc power supply potential may be input as a drive voltage to level shifter 1 from a voltage switching circuit.

Gate control circuit 2 may receive a Vcc power supply potential and may provide a control signal LSCNT having a low level when it has been determined that the received potential is lower than a predetermined value.

Control signal LSCNT having a low level (essentially a ground potential) may be applied to gates of transistors (P105 and P106). In this way, transistors (P105 and P106) may be turned on.

When transistors (P105 and P106) turned on, subsequent operations of level shifter 1 in a Vcc mode may be different from operations of a conventional level shifter.

In a Vcc mode, transistors (P105 and P106) may always be on. Transistors (P103 and P104) may be turned on in response to a logic level of a received input signal IN. In this way, current paths parallel to transistors (P101 and P102) may be provided in a Vcc mode to improve a low to high transition of output signals (BOUT and TOUT).

When input signal IN has a high level (essentially Vcc), transistors N101 may turn on. Inverter V101 may provide a low level (essentially ground) to a gate of transistor N102 and transistor N102 may be turned off. With transistor N101 turned on, output signal BOUT may go low (essentially ground). At the same time, transistors (P102 and P104) may be turned on and may provide parallel current paths to pull output signal TOUT high (essentially Vcc). Transistor P104 may essentially provide a greater pull-up current capacity by summing with a current capacity of transistor P102.

The amount of current flowing through transistor P104 may be determined by the on resistance of series connected transistors (P104 and P106). Accordingly, if transistors (P104 and P106) are regarded as a single transistor, an effective channel width may be expressed as "Wp2·Wp3/(Wp2+Wp3)". Accordingly, in a Vcc mode, transistors (P102, P104, and P106) may provide a pull-up current capacity proportional with the sum of the channel width of transistor P102 and the effective channel width of series connected transistors (P104 and P106), where transistor P104 may have a channel width of Wp2 and transistor P106 may have a channel width of Wp3. Thus, transistors (P102, P104, and P106) may provide an output signal TOUT having a high level (essentially Vcc).

In this way, when input signal IN is high (essentially Vcc), level shifter 1 may provide an output signal BOUT having a low level (essentially ground) and an output signal TOUT having a high level (essentially Vcc).

Channel widths may be set such that the ratio of a pull-up current (current flowing through transistors (P102 and P104 or P101 and P103) and a pull-down current (current flowing through transistor (N102 or N101) may be increased in a Vcc mode as compared to conventional approaches.

Thus, channel widths of transistors (P103 to P106) may be designed in accordance with a channel width of transistors (N101 and N102) and channel widths of transistors (P101 and P102) in a Vcc mode of operation without regard to a Vpp mode of operation.

In this way, the total pull-up channel width that is the sum of a channel width Wp1 of transistor P101 and an effective channel width Wp23 of serially connected transistors (P103 and P105) may be designed to provide a desired current ratio with respect to channel width Wn1 of transistor N101.

Because channel width Wp1 of transistor P101 may be fixed in accordance with a design for a Vpp mode, channel widths Wp2 and Wp3 of transistors (P103 and P105) may be selected to provide the desired pull-up current in a Vcc mode.

The total channel width WT that is the sum of channel width Wp1 of transistor P101 and effective channel width Wp23 for serial connected transistors (P104 and P106) may be obtained in a similar manner as described above for transistors (P101, P103 and P105). In this way, transistors (P104 and P106) may have designed widths.

Channel width Wp3 of transistors (P105 and P106) may be designed to be equal to or smaller than a channel width Wp2 of transistors (P103 and P104).

In level shifter 1 according to the present embodiment, transistors (P105 and P106) may be always on and transistors (P103 and P104) may be selectively turned on to provide an additional pull-up current for output signals (TOUT and BOUT) accordingly. In this way, channel widths of transistors such as p-type IGFETs and transistors such as n-type IGFETs may be selected to provide sufficient switching speed on output signals (TOUT and BOUT) for the Vcc mode of operation in response to logic level changes of an input signal IN.

Channel widths of transistors (P103 and P104) in level shifter 1 of the present embodiment may be set specifically for results in a Vcc mode of operation in accordance with channel width Wn1 of transistors (N101 and N102) and may thus improve transitions speeds of output signals transitioning from a low level to a high level.

As described above, level shifter 1 of the present embodiment may include current paths through transistors (P101 and P102) that may be used to provide a drive current during a Vcc mode and a Vpp mode. Level shifter 1 may also include current paths through transistors (P103 and P104) that may be used to provide an additional drive current during a Vcc mode. Current paths through transistors (P103 and P104) may be enabled by a control signal LSCNT having a predetermined logic level (logic low). Control signal LSCNT may be logic low when a gate control circuit 2 detects that an applied voltage is less than a predetermined potential. Current paths through transistors (P103 and P104) may be disabled by a control signal LSCNT having a predetermined logic level (logic high). Control signal LSCNT may be logic high when a gate control circuit 2 detects than an applied voltage is greater than a predetermined potential. In this way, an equivalent channel width of devices (such as transistors) providing a drive function may be adjusted in accordance with a mode of operation.

An equivalent channel width WT of transistors providing a drive current in a Vcc mode may be essentially "Wp1+Wp23" and may be obtained by summing a channel width Wp1 of transistor P101 and an equivalent channel width Wp23 for series connected transistors (P103 and P105). An equivalent channel width WT in a Vpp mode may be essentially equal to a channel width Wp1 of transistor P101.

As described above, level shifter 1 may operate to adjust an equivalent channel width WT of transistors providing a drive current in accordance with potential levels of a power supply operating in a Vcc mode and a Vpp mode. In this way, a current in a drive transistor (transistor P101 or transistor P102) may be supplemented with a current provided by a boost drive transistor (transistor P103 or transistor P104). Accordingly, a ratio between current in a first logic level providing transistors and a second logic level providing transistors may be adjusted in accordance with respective modes of operation. First and second logic level providing transistors may be p-type IGFETs and n-type IGFETs, as just two examples. A channel width Wn1 of transistors (N101 and N102) may be designed with respect to a Vpp mode of operation without suffering from a conventional problem of slowing a transition of output signals provided in a Vcc mode of operation. In this way, a suitable shift speed of output signals may be obtained for operating modes having different operating potentials.

Figure 4:
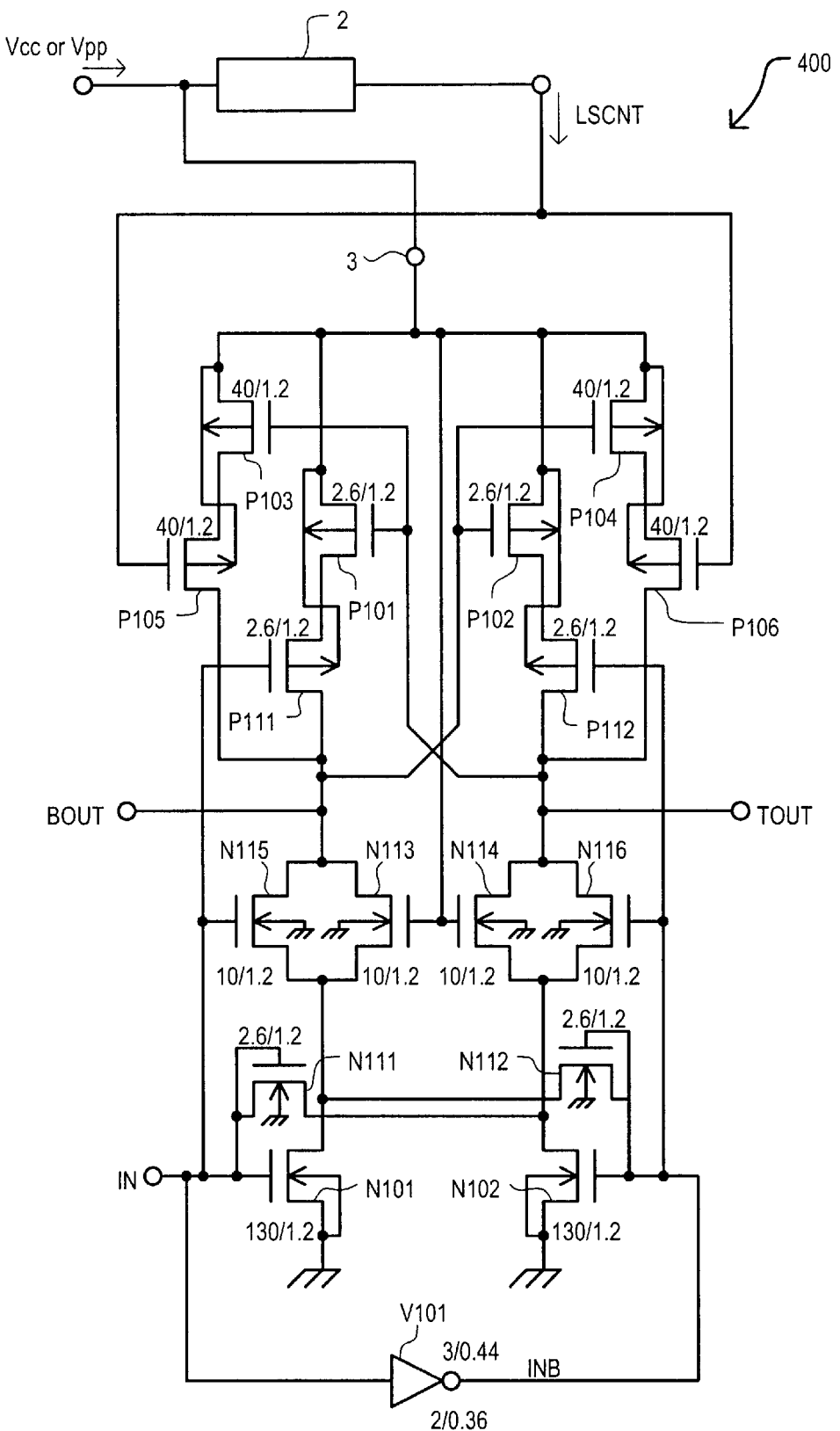
FIG. 4 is a circuit schematic diagram of a level shifter according to an embodiment.

Referring now to FIG. 4, a circuit schematic diagram of a level shifter according to an embodiment is set forth and given the general reference character 400. Level shifter 400 may include similar constituents as level shifter 1 and such constituents may be referred to by the same reference character.

Level shifter 400 may differ from level shifter 1 in that transistors (N111 to N116 and P111 and P112) may be included. Transistors (P111 and P112) may be p-type insulated gate field effect transistors (IGFETs), such as p-channel MOS transistors, as just one example. Transistors (N111 to N116) may be n-type IGFETs, such as n-channel MOS transistors, as just one example. Transistors (N111 to N116 and P111 and P112) may be included for the purpose of snap-back prevention and improvement in hot electron resistance.

Level shifter 400 may receive a voltage potential (VCC or VPP) and an input signal IN and may provide output signals (TOUT and BOUT) at output terminals. Output signals (TOUT and BOUT) may essentially have a logic high value at voltage potential (VCC or VPP) and a logic low essentially at the ground potential. In this way, level shifter 400 may provide output signals (TOUT and BOUT) having a level shifted from voltage potential VCC to voltage potential VPP when voltage potential VPP is applied or output signals (TOUT and BOUT) having an essentially unshifted level when voltage potential VCC is applied.

Transistor P101 may have a source and a body (well or substrate) connected to a voltage terminal 3, a drain connected to a source of transistor P111, and a gate connected to receive output signal TOUT. Transistor P102 may have a source and a body (well or substrate) connected to a voltage terminal 3, a drain connected to a source of transistor P112, and a gate connected to receive output signal BOUT. Transistor N101 may have a source and a body (well or substrate) connected to a ground potential, a drain connected to drains of transistors (N113 and N115), and a source of transistor N112, and a gate connected to receive input signal IN. Transistor N102 may have a source and a body (well or substrate) connected to a ground potential, a drain connected to drains of transistors (N114 and N116), and a source of transistor N111, and a gate connected to receive an output INB of inverter V101. Inverter V101 may receive input signal IN as an input.

Transistor P111 may have a source connected to a drain of transistor P101, a drain connected to output signal BOUT, a gate connected to receive input signal IN and a body (well or substrate) connected to a voltage terminal 3. Transistor P112 may have a source connected to a drain of transistor P102, a drain connected to output signal TOUT, a gate connected to receive an output INB of inverter V101 and a body (well or substrate) connected to a voltage terminal 3. Transistors (P111 and P112) may be provided for snap-back prevention.

Transistor N113 may have a source connected to a drain of transistor N101, a drain connected to output signal BOUT, a gate connected to voltage terminal 3, and a body (well or substrate) connected to a ground potential. Transistor N115 may have a source connected to a drain of transistor N101, a drain connected to output signal BOUT, a gate connected to receive input signal IN, and a body (well or substrate) connected to a ground potential. Transistor N114 may have a source connected to a drain of transistor N102, a drain connected to output signal TOUT, a gate connected to voltage terminal 3, and a body (well or substrate) connected to a ground potential. Transistor N116 may have a source connected to a drain of transistor N102, a drain connected to output signal TOUT, a gate connected to receive an output INB of inverter V101, and a body (well or substrate) connected to a ground potential. Transistors (N13 to N116) may be provided for hot electron prevention.

Transistor N111 may have a gate and a drain commonly connected to receive input signal IN, a source commonly connected to a drain of transistor N102 and a source of transistors (N114 and N116), and a body (well or substrate) connected to a ground potential. Transistor N112 may have a gate and a drain commonly connected to receive an output INB of inverter V101, a source commonly connected to a drain of transistor N101 and a source of transistors (N113 and N115), and a body (well or substrate) connected to a ground potential. Transistors (N111 and N112) may be provided for snap-back prevention.

Numeric values written in the vicinity of each transistor may represent a channel width ($\mu$m)/channel length ($\mu$m). For example, 130/1.2 in the vicinity of transistor N101 may indicate transistor N101 has a channel width of essentially 130 $\mu$m and a channel length of essentially 1.2 $\mu$m.

The operation of level shifter 400 illustrated in FIG. 4 may be substantially the same as the operation of level shifter 1 illustrated in FIG. 1.

Transistors (P101 and P102) may each have a channel width Wp1 of approximately 2.6 $\mu$m and a channel length L of approximately 1.2 $\mu$m. Transistors (N101 and N102) may each have a channel width Wn1 of approximately 130 $\mu$m and a channel length L of approximately 1.2 $\mu$m.

Figure 2:
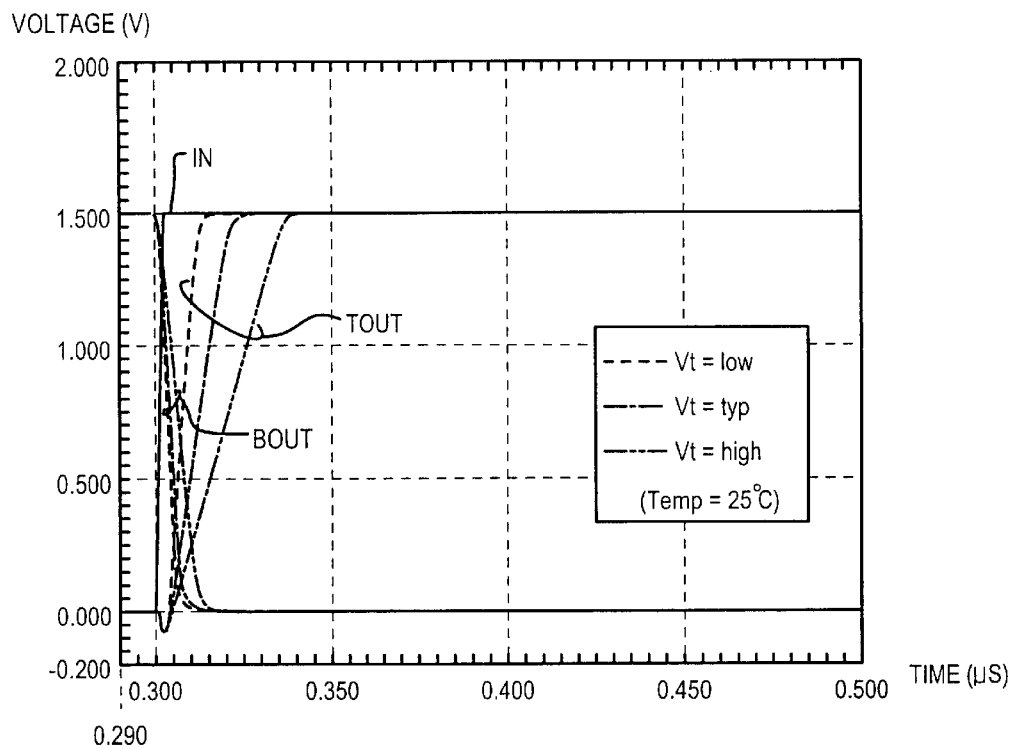
FIG. 2 is a waveform diagram of simulation results of a level shifter in a Vcc mode.
Figure 3:
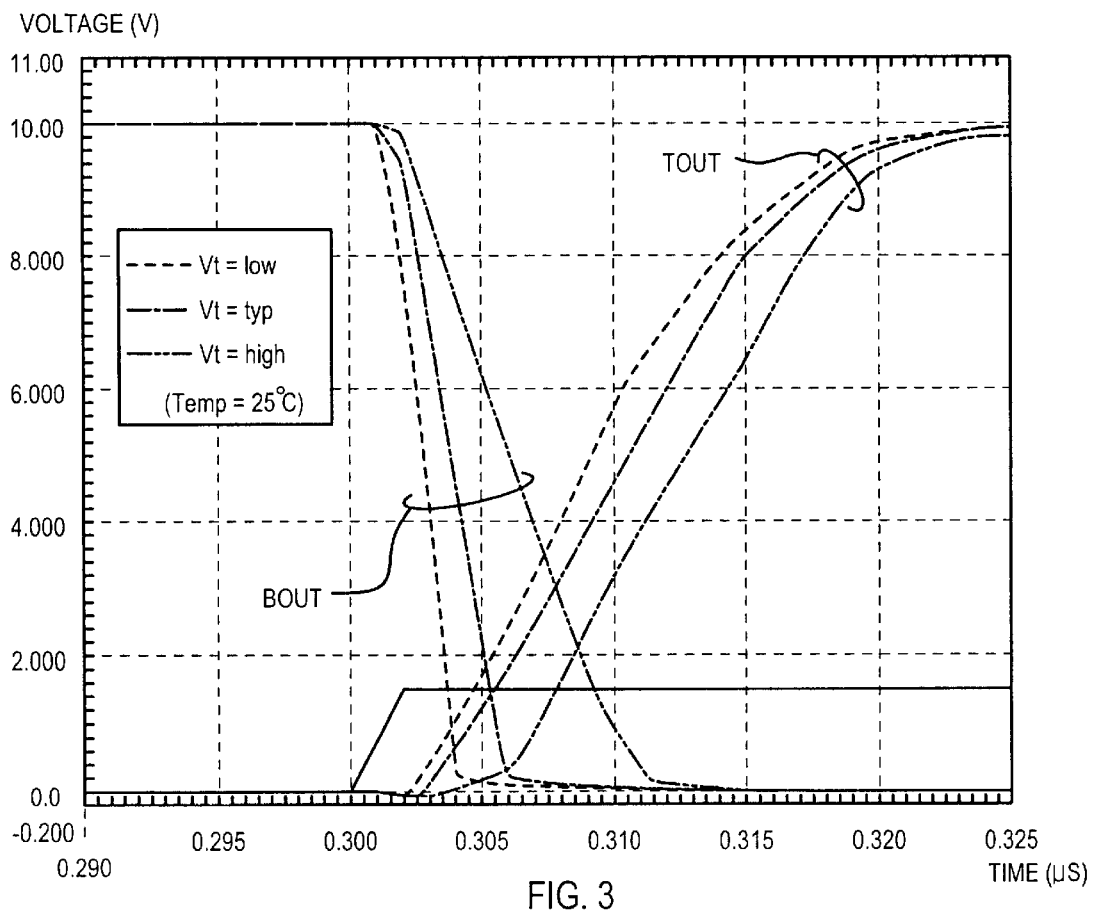
FIG. 3 is a waveform diagram of simulation results of a level shifter in a Vpp mode.
Figure 8:
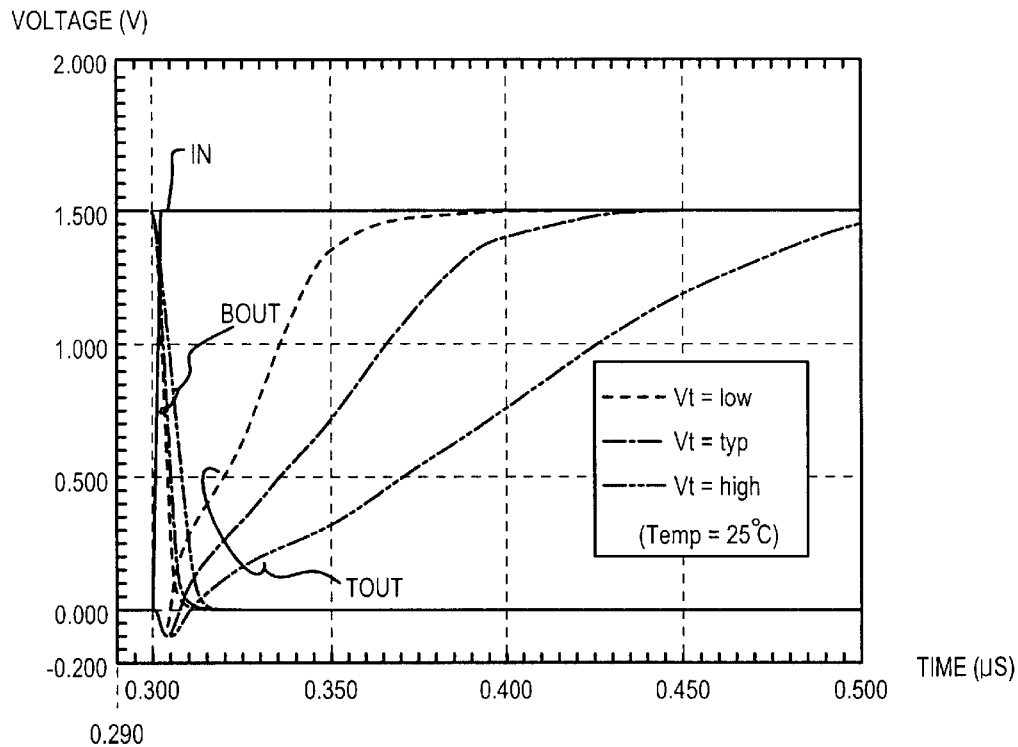
FIG. 8 is a waveform diagram of simulation results of a conventional level shifter in a Vcc mode.
Figure 9:
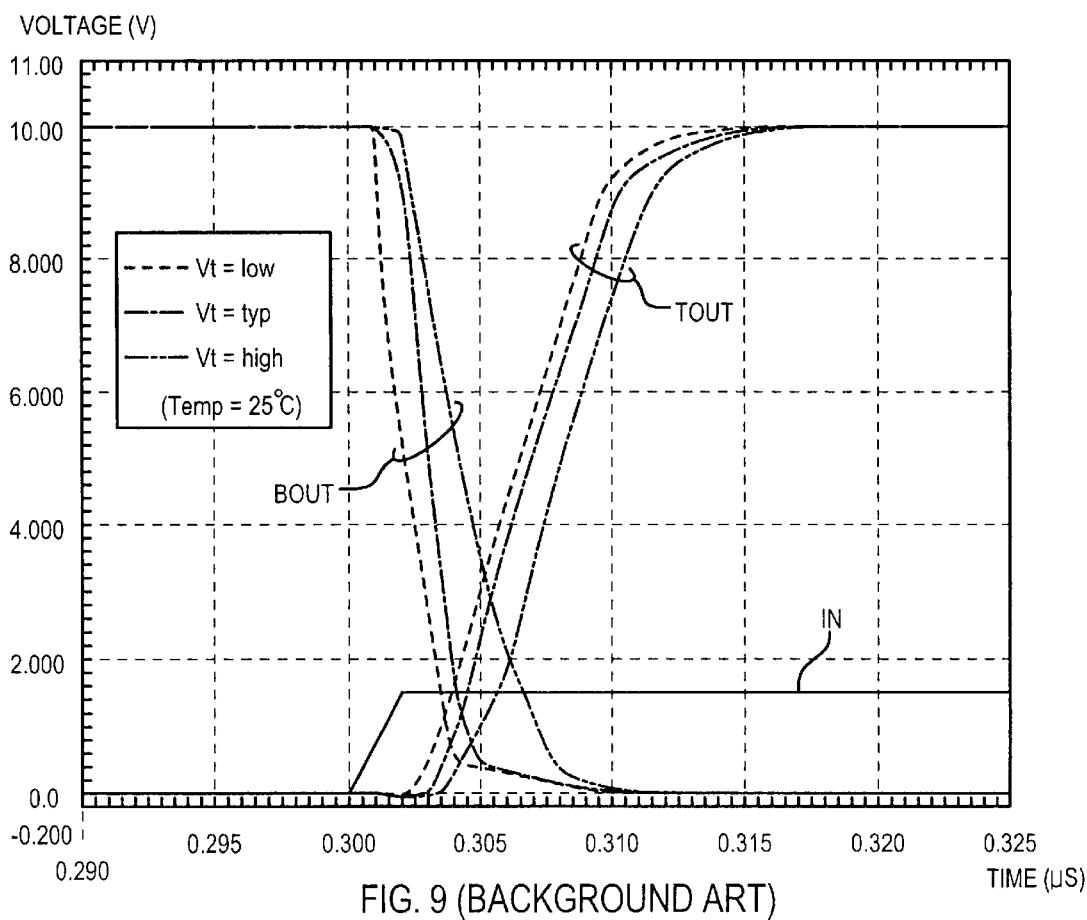
FIG. 9 is a waveform diagram of simulation results of a conventional level shifter in a Vpp mode.

Simulation results of level shifter 400 in a Vcc mode and a Vpp mode are illustrated in FIGS. 2 and 3, respectively. A comparison may be made with a simulation of a conventional level shifter as illustrated in FIGS. 8 and 9.

In FIGS. 2 and 3, the axis of abscissa may indicate time and the axis of ordinate may indicate voltage levels of input signal IN and output signals (TOUT and BOUT).

FIG. 2 may illustrate a Vcc mode of operation of level shifter 400 where Vcc (essentially 1.5 V) may be applied to power supply terminal 3 and ground may be essentially 0 V. FIG. 3 may illustrate a Vpp mode of operation of level shifter 400 where Vpp (essentially 10.0 V) may be applied to power supply terminal 3 and ground may be essentially 0 V.

Also, in FIGS. 2 and 3, simulations results are set forth for three cases of threshold voltages of transistors and illustrated as a low Vt, a typical Vt, and a high Vt. In all three cases the simulations have been conducted for essentially a room temperature (Temp=25° C.). Dashed lines may indicate a low Vt case. Dot-dashed lines may indicate a typical Vt case. Dot-dot-dashed lines may indicate a high Vt case.

As illustrated in FIG. 2, in a Vcc mode of operation, switching times of output signal TOUT of level shifter 400 may be drastically improved when compared to the simulation, as illustrated in FIG. 8, of conventional level shifter 1000. As illustrated, in the high Vt case, the worst case transition time of an output signal TOUT may be drastically improved.

As illustrated in FIG. 3, in a Vpp mode of operation, a switching times of output signals (BOUT and TOUT) may not be substantially affected as compared to the simulation, as illustrated in FIG. 9, of conventional level shifter 1000.

In level shifter 400, according to an embodiment, output signals (TOUT and BOUT) may have a greatly improved low to high transition time in a Vcc mode. As indicated, a drive current may be increased in a Vcc mode by providing a parallel drive current path in a Vcc mode. In this way, an operating speed of level shifter 400 may be improved in a Vcc mode. By designing transistor sizes (P101, P102, N101, and N102) for a Vpp mode, substantial delays in an operating speed of level shifter 400 in a Vpp mode may be avoided.

Likewise, improved operating speeds as mentioned above may apply equally to an embodiment such as level shifter 1, for example.

Figure 5:
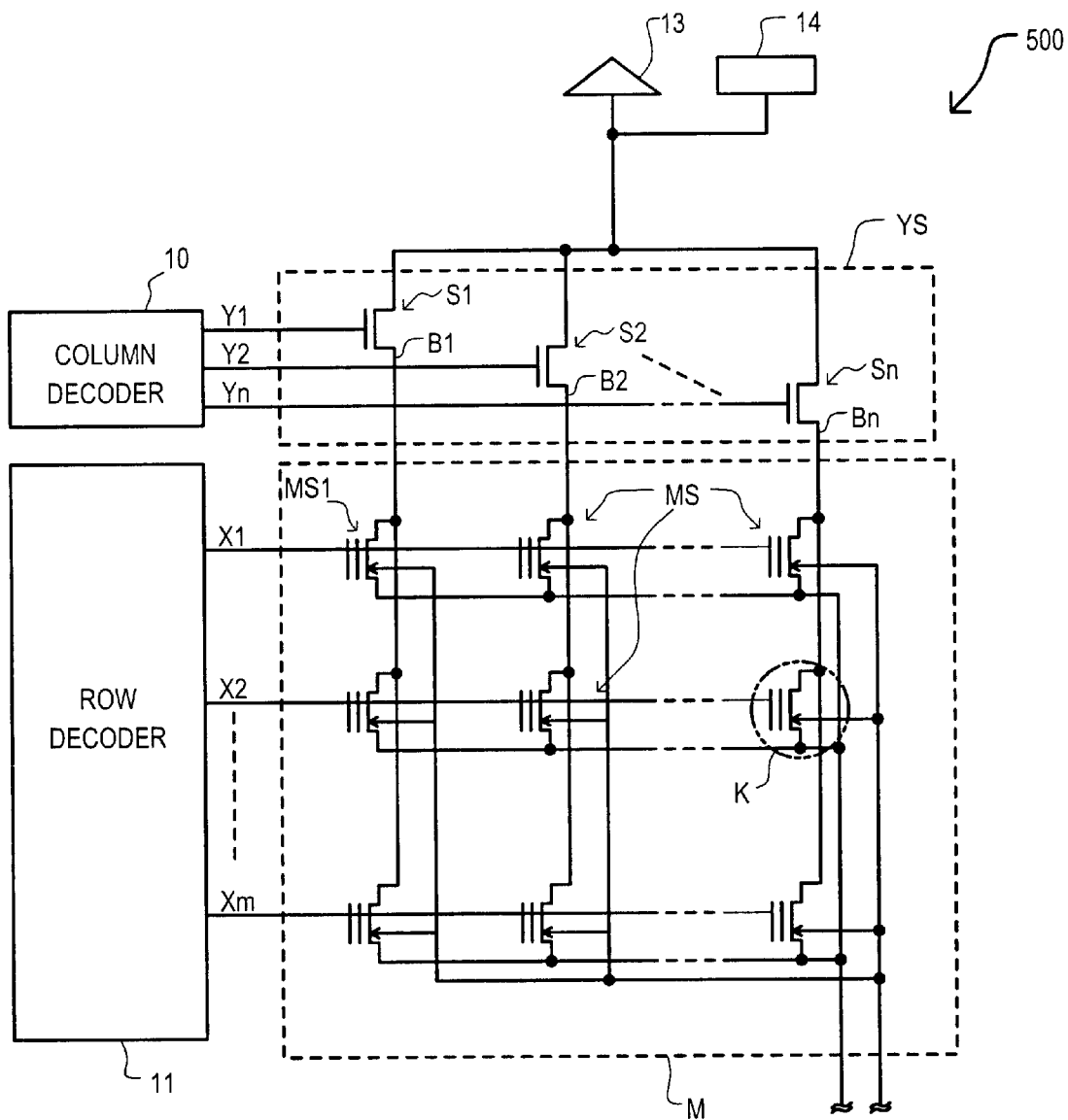
FIG. 5 is a block schematic diagram of a non-volatile memory.
Figure 5:
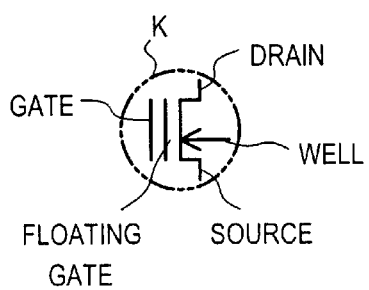
Figure 7:
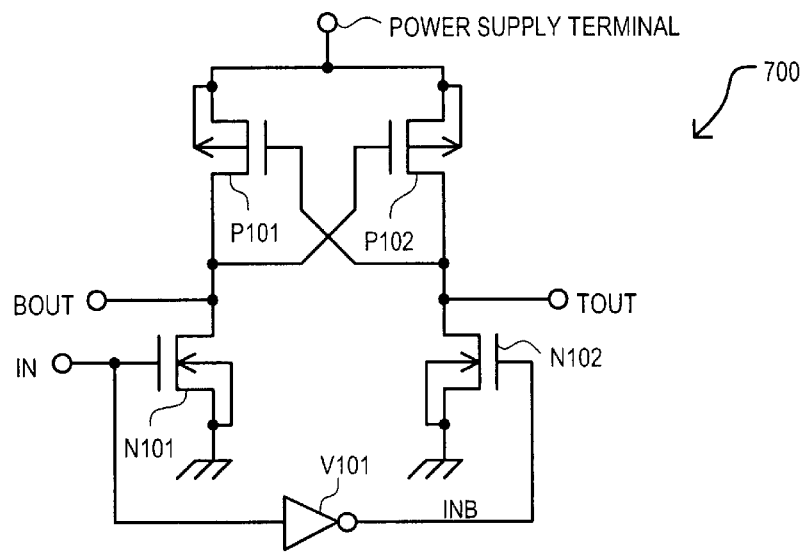
FIG. 7 is a circuit schematic diagram of a conventional level shifter.

Referring now to FIG. 5, a non-volatile memory is set forth in a block schematic diagram and given the general reference character 500. Non-volatile memory 500 may be a flash memory. FIG. 5 is a conceptual diagram illustrating only blocks of non-volatile memory 500 that may be required for reading and writing.

Non-volatile memory may include a memory cell region M, a column selecting switch YS, a column decoder 10, a row decoder 11, a reading circuit 13, and a writing circuit 14.

Memory cell region M may include a plurality of memory cells MS arranged in a matrix or lattice. A memory cell MS in region K has been enlarged. A memory cell MS may differ from a typical MOS transistor in that a floating gate may be formed between a control gate and a substrate (well) and isolated by an insulating film.

During a write operation, electric charge may be injected into a floating gate of a memory cell MS to change the threshold voltage to indicate a logic level of a stored bit. In this way, memory cells MS may store data.

In memory cell region M, drains of memory cells MS in a column may be respectively connected to a bit line (B1 to Bn). Control gates of memory cells MS in a row may be respectively connected to a word line (X1 to Xm). Sources of each memory cell MS in memory cell region M may be commonly connected to a voltage control circuit (not shown) that may control an applied source voltage. Memory cells MS may be formed in a well which may be connected to a voltage control circuit (not shown) that may control an applied well voltage.

Row decoder 11 may receive a row address (not shown) and may activate word lines (X1 to Xm). Column decoder 10 may receive a column address (not shown) and may provide column select signals (Y1 to Yn).

Column select switch YS may receive column select signals (Y1 to Yn) and may provide an electrical connection between a bit line (B1 to Bn) and reading and writing circuits (13 and 14). Column select switch YS may include switches (S1 to Sn). Each switch (S1 to Sn) may include a transistor having a drain commonly connected to an input of reading circuit 13 and an output of writing circuit 14, a gate connected to receive a respective column select signal (Y1 to Yn), and a source connected to a respective bit line (B1 to Bn). Each switch (S1 to Sn) may include a transistor, such as a n-type IGFET, for example a n-channel MOS transistor, as just one example.

Data writing and reading operations to and from memory cells MS will now be described. In order to simplify the description, read and write operations to and from memory cell MS1 will be used as an example.

When data is written, a gate voltage of approximately 9 V, a well voltage of approximately 0 V, a source voltage of approximately 0 V, and a drain voltage of approximately 6 V may be applied to a memory cell MS to which data is written.

However, when data is read, a gate voltage of approximately 5 V, a well voltage of approximately 0 V, a source voltage of approximately 0 V, and a drain voltage of approximately 1 V may be applied to a memory cell MS from which data is read.

Write Operation

During a write operation, writing circuit 14 may output a writing voltage of approximately 6 V. During the write operation, an output of reading circuit 13 may be in a tri-state or floating.

Column decoder 10 may activate (logic high) column select signal Y1 in accordance with a received column address value, which may be applied externally. All other column select signals (Y2 to Yn) may remain low. When activated during a write operation, column select signal Y1 may have a potential of approximately 8 V in order to allow switch S1 to provide a full write voltage (approximately 6 V) onto bit line B1.

Column decoder 10 may include a level shifter which may allow column decoder 10 to drive active column select signal Y1 to a Vpp voltage (approximately 8 V in this case). A Vpp voltage may be internally generated by a booster circuit operating to boost a Vcc voltage (approximately 1.5 V in this case). Thus, a level shifter, such as level shifter 1 as illustrated in FIG. 1, may be used in column decoder 10.

A row decoder 11 may activate a word line X1 in response to an address signal which may be externally applied. Row decoder 11 may drive word line X1 to an active potential of approximately 9 V. In this way, a write potential of approximately 9 V may be applied to control gates of a row of memory cell MS including memory cell MS1.

With writing circuit 14 applying approximately 6 V to column select circuit YS and switch S1 turned on by receiving a column select signal potential of approximately 8 V, bit line B1 may be driven to approximately 6 V by a current path through switch S1. Control gate of memory cell MS1 receive a word line potential of approximately 9 V, and a source of memory cell MS1 receiving a source potential of approximately 0 V. Thus, memory cell MS1 may have a current flowing from a drain to a source and hot electron charges may be injected and may accumulate on a floating gate. In this way, data may be written into a particular memory cell MS, in this case memory cell MS1.

It is noted in a write operation, although a write voltage of 9 V may be applied to control gates in a row of memory cells MS, only one memory cell (MS1 in the example) in the row of memory cells MS may have a drain voltage of approximately 6 V because only switch S1 may be turned on while other switches (S1 to Sn) may be turned off. Thus, a write current may not appear memory cells MS in other than selected memory cell MS1.

Read Operation

During a read operation, reading circuit 13 may output a read voltage of approximately 1.0 V, which may be received by column select circuit YS. A read voltage provided by reading circuit 13 may be a data line precharge level. During the read operation, an output of writing circuit 14 may be tri-state or floating.

Column decoder 10 may activate (logic high) column select signal Y1 in accordance with a received column address value, which may be applied externally. All other column select signals (Y2 to Yn) may remain low. When activated during a read operation, column select signal Y1 may have a potential of approximately 1.5 V, which may allow a full read voltage (approximately 1.5 V) onto bit line B1.

Column decoder 10 may include a level shifter, such as level shifter 1 as illustrated in FIG. 1, may be used in column decoder 10. In this way, column decoder 10 may drive column select signal Y1 to a high level relatively rapidly.

A row decoder 11 may activate a word line X1 in response to an address signal which may be externally applied. Row decoder 11 may drive word line X1 to an active potential of approximately 5 V. In this way, a read potential of approximately 5 V may be applied to control gates of a row of memory cell MS including memory cell MS1.

With reading circuit 13 applying approximately 1 V to column select circuit YS and switch S1 turned on by receiving a column select signal potential of approximately 1.5 V, bit line B1 may be driven to approximately 1 V by a current path through switch S1. Control gate of memory cell MS1 receive a word line potential of approximately 5 V, and a source of memory cell MS1 receiving a source potential of approximately 0 V. A sense amplifier may detect current flowing through bit line B1 to determine whether or not memory cell MS1 has been programmed. In this way, data may be read from a particular memory cell MS, in this case memory cell MS1.

It is noted in a read operation, although a read voltage of 5 V may be applied to control gates in a row of memory cells MS, only one memory cell (MS1 in the example) in the row of memory cells MS may have a drain voltage of approximately 1 V because only switch S1 may be turned on while other switches (S1 to Sn) may be turned off.

In the above-mentioned description, a read operation may refer to a Vcc mode of operation for a level shifter, such as level shifter 1, in column decoder 10. A write operation may refer to a Vpp mode of operation for a level shifter, such as level shifter 1, in column decoder 10.

Figure 6:
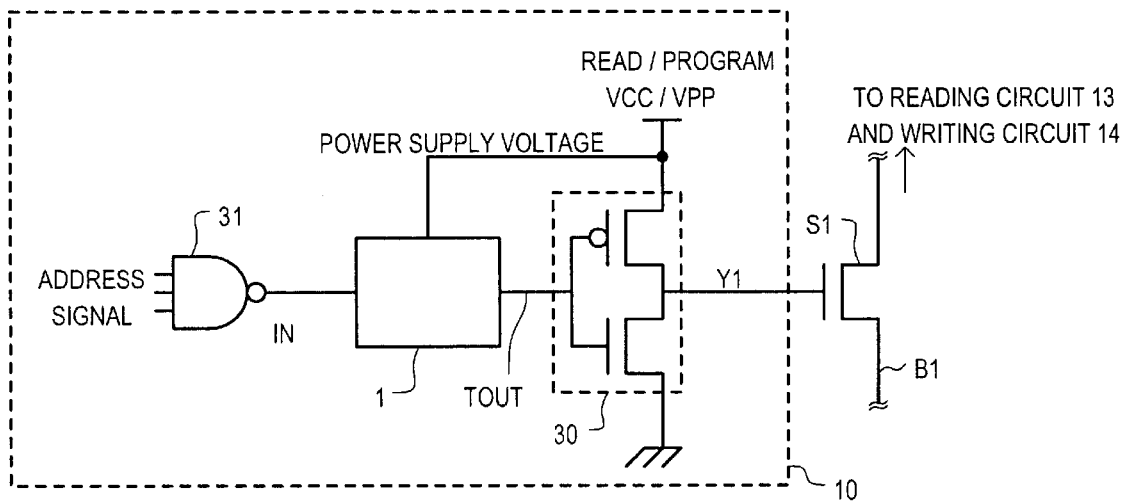
FIG. 6 is a circuit schematic diagram of a column decoder and a switch according to an embodiment.

Referring now to FIG. 6, a circuit schematic diagram of column decoder 10 and switch S1 according to an embodiment is set forth.

Column decoder 10 may include a decoder 31, level shifter 1, and a buffer 30. Decoder 31 may receive an address signal and may provide a signal IN to an input of level shifter 1. Decoder 31 may be a NAND circuit, as just one example. Level shifter 1 may receive a power supply voltage, which may be a Vcc voltage during a read operation and may be a Vpp voltage in a write operation. Level shifter 1 may provide a signal TOUT to an input of buffer 30. Buffer 30 may be powered by a power supply voltage, which may be a Vcc voltage during a read operation and may be a Vpp voltage in a write operation, and may provide column select signal Y1 as an output. Buffer 30 may be a complementary MOS (CMOS) inverter (buffer), as just one example.

Switch S1 may receive column select signal Y1 at a control gate.

When all addresses of address signal are high, decoder 31 may provide signal IN having a low level.

When signal IN is low, level shifter 1 may provide a signal TOUT having a low level. With signal TOUT having a low level, buffer 30 may provide a column select signal Y1 having a high output. In this way, a switch S1 may be turned on and a column (such as a column corresponding to bit line B1) may be selected.

However, when any address of address signal is low, decoder 31 may provide signal IN having a high level. It is noted, decoder 31 may be powered by a power supply at a Vcc potential. Thus, signal IN may be approximately 1.5 V, for example, when high.

When signal IN is high, level shifter 1 may provide a signal TOUT having a high level. With signal TOUT having a high level, buffer 30 may provide a column select signal Y1 having a low output. In this way, a switch S1 may be turned off and a column (such as a column corresponding to bit line B1) may be unselected.

If the transition time of signal TOUT provided by level shifter 1 is slow (either for a low to high or a high to low transition), the timing of column select signal Y1 may be delayed. In this way, the read and/or write operations may be delayed.

It is noted that level shifter 400 may be used in column decoder 10.

Compared to a conventional level shifter, level shifter (1 and 400) according to embodiments may have an improved overall transition time of an output signal TOUT in a Vcc and a Vpp mode of operation. In this way, a delay in a read operation and write operation may be reduced.

Also, by improving a transition time of an output signal TOUT, a long sloping waveform may be eliminated. If output signal TOUT has a long sloping waveform, buffer 30 may have a flow through current from a power supply to ground for a relatively long period of time. This may cause an increase in power consumption. Thus, by improving a transition time of an output signal TOUT, a long sloping waveform may be eliminated and power consumption may be reduced.

Level shifter (1 and 400) according to an embodiment may have an improved transition time of an output signal TOUT. By improving a transition time of output signal TOUT, buffer 30 may provide column select signal Y1 having an improved transition time.

It is understood that the embodiments described above are exemplary and the present invention should not be limited to those embodiments. Specific structures should not be limited to the described embodiments.

For example, although a level shifter has been applied in a column decoder 10 of a non-volatile memory device, such as a flash memory, the invention may be employed as a level shifter in other circuits within a non-volatile memory device that may have differing power supply potentials in various modes of operation. As just one example, a level shifter, such as illustrated in the embodiments may be used in a row decoder in a non-volatile memory device.

The present invention may be used in other applications than a non-volatile memory device. For example, the present invention may be used in other devices or systems including circuits operating in various modes of operation in which differing power supply potentials may be used. For example, the present invention may be used for an interface between systems operating at differing power supply voltages.

The present invention may be used in a non-volatile memory, such as an EEPROM (electrically erasable programmable read only memory), as a buffer circuit that may provide a voltage translation for a high logic level between a received signal and an output signal, as just an example.

Although the embodiments have been described with reference to providing differing effective channel widths for drive devices in a level shifter providing a pull-up for a logic signal, it may be applicable for drive devices in a level shifter providing a pull-down for a logic signal, as just one example According to the embodiments, a level shifter may operate by adjusting an effective channel width WT of drive devices, such as p-type IGFETs, in accordance with modes of operation in which supply voltages may differ. Such drive devices may provide a pull-up for a logic signal, as just one example. In this way, a balance between a drive current in drive devices, such as p-type IGFETs, and a drive current in drive devices, such as n-type IGFETs may be adjusted in accordance with respective modes of operation. A channel width Wn1 of drive devices, such as n-type IGFETs, may be designed to be large for a mode of operation, such as a Vpp mode, without drastically slowing a transition time of an output signal when another mode of operation, such as a Vcc mode, is being executed. In this way, improved transition times of output signals may be obtained for differing power supply voltages.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A level shifter, comprising:

a first drive circuit coupled between a first power supply terminal and a first output node;

a second drive circuit coupled between the first power supply terminal and a second output node;

a third drive circuit coupled between a reference potential and the first output node;

a fourth drive circuit coupled between the reference potential and the second output node; and the first drive circuit having a first effective drive circuit width and the second drive circuit having a second effective drive circuit width wherein the first and second effective drive circuit widths are adjusted in accordance with a voltage level of the first power supply terminal.

2. The level shifter according to claim 1, wherein:

the first drive circuit includes a first insulated gate field effect transistor (IGFET) having a first type conductivity and a second IGFET having the first type conductivity providing parallel current paths between the first power supply potential and the first output node wherein the first IGFET has a control gate coupled to the second output node and the second IGFET has a control gate coupled to the second output node; and the second drive circuit includes a third IGFET having the first type conductivity and a fourth IGFET having the first type conductivity providing parallel current paths between the first power supply potential and the second output node wherein the third IGFET has a control gate coupled to the first output node and the fourth IGFET has a control gate coupled to the first output node.

3. The level shifter according to claim 2, further including:

the third drive circuit includes a fifth IGFET having a second type conductivity and having a current path coupled between the first output node and the reference potential and having a control gate coupled to receive a first input signal;

the fourth drive circuit includes a sixth IGFET having the second type conductivity and having a current path coupled between the second output node and the reference potential and having a control gate coupled to receive a second input signal.

4. The level shifter according to claim 3, wherein:

the first drive circuit includes a seventh IGFET having the first type conductivity and having a current path coupled between the second IGFET and the first output node; and the second drive circuit includes an eighth IGFET having the first type conductivity and having a current path coupled between the fourth IGFET and the second output node wherein the current paths of the seventh IGFET and eighth IGFET are enabled and disabled in accordance with the voltage level of the first power supply terminal.

5. The level shifter according to claim 4, further including:

a control circuit coupled to receive the voltage level of the first power supply terminal and providing a control signal coupled to a control gate of the seventh IGFET and a control gate of the eighth IGFET.

6. The level shifter according to claim 5, wherein:

the control signal disables the current paths of the seventh and eighth IGFETs when the voltage level of the first power supply terminal exceeds a predetermined potential and enables the current paths of the seventh and eighth IGFETs when the voltage level of the first power supply terminal does not exceed the predetermined potential.

7. The level shifter according to claim 1, wherein:

the level shifter is provided in a column decoder that selects at least one column of memory cells, arranged in a matrix of rows and columns of memory cells, in response to an address value and the level shifter operates at different voltage levels based on a data read operation or a data write operation.

8. A level shifter, comprising:

a first drive current path coupled between a power supply node and an output node;

a second drive current path coupled between the power supply node and the output node wherein the second drive current path is enabled when the power supply node is at a first potential and disabled when the power supply node is at a second potential.

9. The level shifter according to claim 8, wherein:

the first potential is lower than the second potential.

10. The level shifter according to claim 9, wherein:

the level shifter is coupled to receive an input signal having a first logic level at essentially the first potential.

11. The level shifter according to claim 10, wherein:

the input signal has a second logic level at essentially a ground potential.

12. The level shifter according to claim 8, wherein:

the level shifter is included in a decode circuit on a semiconductor memory device.

13. The level shifter according to claim 12, wherein:

the semiconductor memory device is an electrically programmable non-volatile memory and the power supply node is at the first potential during a read operation and at the second potential during a write operation.

14. A semiconductor device, comprising:

a first mode of operation where a first power supply potential is supplied to a power supply terminal and a second mode of operation where a second power supply potential is supplied to the power supply terminal;

a level shifter providing a shift between the first power supply potential and the second power supply potential in the first mode of operation, the level shifter including a first drive circuit coupled to provide a first current path between the power supply terminal and a first output node in response to a first logic level of an input signal; and a second drive circuit coupled to provide a second current path between the power supply terminal and the first output node in response to the first logic level of the input signal when in the second mode of operation and provide a high impedance path between the power supply terminal and the first output node in the first mode of operation.

15. The semiconductor device according to claim 14, wherein:

the first drive circuit includes a first insulated gate field effect transistor (IGFET) coupled to provide a low impedance path between the power supply terminal and the first output node in response to the first logic level of the input signal and a high impedance path between the power supply terminal and the first output node in response to a second logic level of the input signal; and the second drive circuit includes a second IGFET coupled to provide a low impedance path between the power supply terminal and the first output node in response to the first logic level of the input signal and a high impedance path between the power supply terminal and the first output node in response to the second logic level of the input signal.

16. The semiconductor device according to claim 15, wherein:

the second drive circuit includes a third IGFET coupled between the power supply terminal and the first output node in series with the second IGFET and coupled to provide a low impedance path between the power supply terminal and the first output node in the second mode of operation and a high impedance path between the power supply terminal and the first output node in the first mode of operation.

17. The semiconductor device according to claim 16, wherein:

the level shifter includes a third drive circuit coupled to provide a third current path between a reference potential and the first output node in response to the second logic level of the input signal.

18. The semiconductor device according to claim 14, wherein the level shifter includes:

a fourth drive circuit coupled to provide a fourth current path between the power supply terminal and a second output node in response to the second logic level of the input signal; and a fifth drive circuit coupled to provide a fifth current path between the power supply terminal and the second output node in response to the second logic level of the input signal when in the second mode of operation and provide a high impedance path between the power supply terminal and the second output node in the first mode of operation.

19. The semiconductor device according to claim 18, wherein:

the first drive circuit includes a first IGFET coupled to provide a low impedance path between the power supply terminal and the first output node in response to the first logic level of the input signal and a high impedance path between the power supply terminal and the first output node in response to a second logic level of the input signal;

the second drive circuit includes a second IGFET coupled to provide a low impedance path between the power supply terminal and the first output node in response to the first logic level of the input signal and a high impedance path between the power supply terminal and the first output node in response to the second logic level of the input signal;

the fourth drive circuit includes a third IGFET coupled to provide a low impedance path between the power supply terminal and the second output node in response to the second logic level of the input signal and a high impedance path between the power supply terminal and the second output node in response to the first logic level of the input signal; and the fifth drive circuit includes a fourth IGFET coupled to provide a low impedance path between the power supply terminal and the second output node in response to the second logic level of the input signal and a high impedance path between the power supply terminal and the second output node in response to the first logic level of the input signal.

20. The semiconductor device according to claim 14, wherein:

the second power supply potential is generated by boosting the first power supply potential.

* * * * *